(12) United States Patent
Tokashiki et al.

(10) Patent No.: US 11,417,565 B2
(45) Date of Patent: *Aug. 16, 2022

(54) METHODS OF FORMING HIGH ASPECT RATIO OPENINGS AND METHODS OF FORMING HIGH ASPECT RATIO FEATURES

(71) Applicant: Micron Technology, Inc., Boise, ID (US)

(72) Inventors: Ken Tokashiki, Boise, ID (US); John A. Smythe, Boise, ID (US); Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/155,770

(22) Filed: Jan. 22, 2021

(65) Prior Publication Data

US 2021/0143055 A1    May 13, 2021

Related U.S. Application Data

(63) Continuation of application No. 15/858,021, filed on Dec. 29, 2017, now Pat. No. 10,903,109.

(51) Int. Cl.
*H01L 21/768*    (2006.01)
*H01L 21/3065*   (2006.01)
(Continued)

(52) U.S. Cl.
CPC .. *H01L 21/76804* (2013.01); *H01L 21/30655* (2013.01); *H01L 21/31116* (2013.01);
(Continued)

(58) Field of Classification Search
CPC ......... H01L 21/76804; H01L 21/30655; H01L 21/76843; H01L 21/76205; H01L 21/76816; H01L 21/76831
(Continued)

(56) References Cited

U.S. PATENT DOCUMENTS 6,261,962 B1   7/2001   Bhardwaj et al.
9,378,971 B1   6/2016   Briggs et al.
(Continued)

FOREIGN PATENT DOCUMENTS

TW   201010012 A   3/2010
TW   201011863 A   3/2010
TW   201724254 A   7/2017

OTHER PUBLICATIONS

Taiwanese Office Action and Search Report from Taiwanese Application No. 107144921, dated Aug. 15, 2019, 10 pages.
(Continued)

*Primary Examiner* — Duy Vu N Deo
(74) *Attorney, Agent, or Firm* — TraskBritt

(57) ABSTRACT

Methods of forming high aspect ratio openings. The method comprises removing a portion of a dielectric material at a temperature less than about 0° C. to form at least one opening in the dielectric material. The at least one opening comprises an aspect ratio of greater than about 30:1. A protective material is formed in the at least one opening and on sidewalls of the dielectric material at a temperature less than about 0° C. Methods of forming high aspect ratio features are also disclosed, as are semiconductor devices.

20 Claims, 3 Drawing Sheets

(51) Int. Cl.
  *H01L 21/762* (2006.01)
  *H01L 21/311* (2006.01)
(52) U.S. Cl.
  CPC .. *H01L 21/76205* (2013.01); *H01L 21/76816* (2013.01); *H01L 21/76843* (2013.01); *H01L 21/76831* (2013.01)
(58) Field of Classification Search
  USPC .................... 438/668, 675, 694, 696, 700
  See application file for complete search history.

(56) References Cited

U.S. PATENT DOCUMENTS

| | | | |
|---|---|---|---|
| 9,384,998 | B2 | 7/2016 | Hudson et al. |
| 9,543,148 | B1* | 1/2017 | Hudson .............. H01L 21/67201 |
| 9,735,232 | B2 | 8/2017 | Yang et al. |
| 10,903,109 | B2* | 1/2021 | Tokashiki .......... H01L 21/76816 |
| 2007/0032054 | A1 | 2/2007 | Ramaswamy et al. |
| 2007/0152306 | A1 | 7/2007 | Shih et al. |
| 2008/0044960 | A1 | 2/2008 | Al-Bayati et al. |
| 2008/0293251 | A1 | 11/2008 | Aoki et al. |
| 2010/0001378 | A1 | 1/2010 | Denatale et al. |
| 2011/0121427 | A1 | 5/2011 | Stupar et al. |
| 2011/0207323 | A1 | 8/2011 | Ditizio |
| 2012/0225554 | A1 | 9/2012 | Yoon et al. |
| 2012/0270404 | A1 | 10/2012 | Bajaj et al. |
| 2014/0162453 | A1 | 6/2014 | Lee et al. |
| 2015/0371869 | A1 | 12/2015 | Surla et al. |
| 2016/0163558 | A1 | 6/2016 | Hudson et al. |
| 2017/0011987 | A1* | 1/2017 | Lee ........................ H01L 23/481 |
| 2017/0076945 | A1 | 3/2017 | Hudson et al. |
| 2017/0170026 | A1 | 6/2017 | Hudson et al. |
| 2017/0178920 | A1 | 6/2017 | Dole et al. |
| 2017/0365487 | A1* | 12/2017 | Shen ........................ C23C 16/26 |

OTHER PUBLICATIONS

Taiwanese Second Office Action for Application No. 107144921, dated Feb. 19, 2020, 12 pages.
Taiwanese Notice of Allowance for Application No. 1071449231, completed Jul. 30, 2021, 5 pages.
Taiwanese First Office Action for Application No. 109137266, dated Oct. 5, 2021, 9 pages.
Taiwanese Second Office Action for Application No. 109137266, dated Jan. 18, 2022, 12 pages.

* cited by examiner

METHODS OF FORMING HIGH ASPECT RATIO OPENINGS AND METHODS OF FORMING HIGH ASPECT RATIO FEATURES

CROSS-REFERENCE TO RELATED APPLICATION

This application is a continuation of U.S. patent application Ser. No. 15/858,021, filed Dec. 29, 2017, now U.S. Pat. No. 10,903,109, issued Jan. 26, 2021 the disclosure of which is hereby incorporated herein in its entirety by this reference.

TECHNICAL FIELD

Embodiments disclosed herein relate to semiconductor fabrication including methods of forming high aspect ratio (HAR) openings and related semiconductor devices. More particularly, embodiments of the disclosure relate to methods of forming HAR openings where the HAR openings are formed at a temperature of less than about 0° C. and a protective material is formed in the HAR openings at a temperature of less than about 0° C., and to related semiconductor devices.

BACKGROUND

A continuing goal of the semiconductor industry has been to increase the memory density (e.g., the number of memory cells per memory die) of memory devices, such as non-volatile memory devices (e.g., NAND Flash memory devices), and to decrease dimensions of the memory devices. One way of increasing memory density in non-volatile memory devices is to implement vertical memory array (also referred to as a "three-dimensional (3D) memory array") architectures. To form 3D memory devices, openings (e.g., vias) are formed in and through one or more dielectric materials, the openings having high aspect ratios, and features are subsequently formed in the openings. Between the increased aspect ratios of the openings and the decreased dimensions of the memory devices, uniformly forming the high aspect ratio openings becomes problematic. Rather than having a uniform width, the high aspect ratio openings have a non-uniform width because the dielectric material is not uniformly etched in the vertical and horizontal directions by conventional anisotropic etch techniques. Therefore, sidewalls of the dielectric material are not substantially vertical and may exhibit a bowed profile, with a greater width at a middle portion of the opening compared to the width of a top portion or bottom portion of the opening. The bowing and non-uniform profile of the sidewalls of the dielectric material compromise structural and electronic integrity of the 3D memory devices including such conventionally formed high aspect ratio openings, leading to device failure.

To reduce bowing, polymers have been formed on the sidewalls of the dielectric material to protect the sidewalls from overetching. The polymers are conformally formed on the sidewalls of the openings to passivate the sidewalls. The polymers are formed at a temperature of 20° C. or greater, such as 50° C. or greater, or 200° C. of greater. At lower temperatures, reactants used to form the polymers are not reactive or are not sufficiently reactive to form the polymers at a practical rate. Further, as the aspect ratios of the openings increase, it is difficult to conformally form these polymers in the openings, especially in the middle portion and lower portion of the openings, because the reactants do not penetrate the entire depth of the openings. Instead, the polymers are formed less thickly (e.g., thinner) or not at all in the middle and lower portion. Since these regions of the openings are not protected by the polymers, the dielectric material is more heavily etched during subsequent etch acts, leading to bowing of the dielectric material.

In order to form the features having the desired aspect ratio and of acceptable dimensional uniformity, multiple decks of the dielectric materials are formed successively, with each deck corresponding to a portion of the depth of the features. A portion of each of the high aspect ratio openings is formed in each deck and filled with material(s) of the features before forming the next deck. As shown in FIG. 1, this results in interfaces (dashed line) between the material(s) of the features of the decks. In addition, the resulting non-vertical sidewalls cause a pinching in of the dielectric material between vertically adjacent decks.

DETAILED DESCRIPTION

Figure 1:
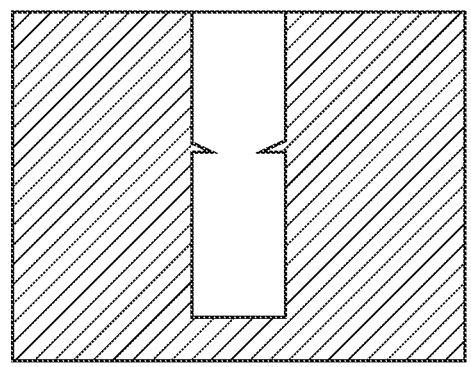
FIG. 1 is a schematic, cross-sectional view of a conventional semiconductor device.

A method of forming high aspect ratio (HAR) openings in a dielectric material is disclosed. The HAR openings are formed at a temperature of less than about 0° C. The HAR openings are formed by removing a portion of the dielectric material in a downward direction from an exposed surface of the dielectric material. A protective material is formed on sidewalls of the HAR openings (e.g., sidewalls of the dielectric material). The protective material protects the sidewalls of the dielectric material from lateral etching during subsequent process acts, reducing bowing of the sidewalls of the dielectric material. The protective material also exhibits a high degree of selectivity to a hardmask material used to form the HAR openings. An etch composition used to form the HAR openings and the protective material includes at least one etch gas, at least one additive gas, and at least one protective material precursor. The protective material is compatible with the subsequent process acts and may be an organic material or an inorganic material, such as an insulative organic polymer, a conductive organic polymer, a boron-containing material, a sulfur-containing material, or a metal. The protective material is formed at a temperature of less than about 0° C., and may be formed in the presence or in the absence of a plasma. The referenced temperatures are those of an electrostatic chuck upon which a substrate including the dielectric material and protective material is positioned. The protective material is formed at a high degree of conformality and is resistant to process conditions (e.g., etch composition, time, temperature, pressure) used to form the HAR openings and the protective material.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor structure or a complete process flow for manufacturing semiconductor devices and the structures described below do not form a complete semiconductor device. Only those process acts and structures necessary to understand the embodiments described herein are described in detail below. Additional acts to form a complete semiconductor device may be performed by conventional techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, the term "aspect ratio" means and includes a ratio of a depth of an opening to a width (e.g., diameter) of the opening. The width of the opening is measured proximate the opening. The aspect ratio of the HAR opening may be greater than about 20:1, greater than about 30:1, greater than about 40:1, greater than about 50:1, greater than about 60:1, greater than about 70:1, greater than about 80:1, greater than about 90:1, or greater than about 100:1 at its final depth. In some embodiments, the HAR opening has an aspect ratio of greater than about 50:1 at its final depth. In other embodiments, the HAR opening has an aspect ratio of greater than about 80:1 at its final depth. In yet other embodiments, the HAR opening has an aspect ratio of greater than about 90:1 at its final depth. In yet still other embodiments, the HAR opening has an aspect ratio of greater than about 100:1 at its final depth.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. One or more of the materials may be thermally sensitive. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

Figure 2:
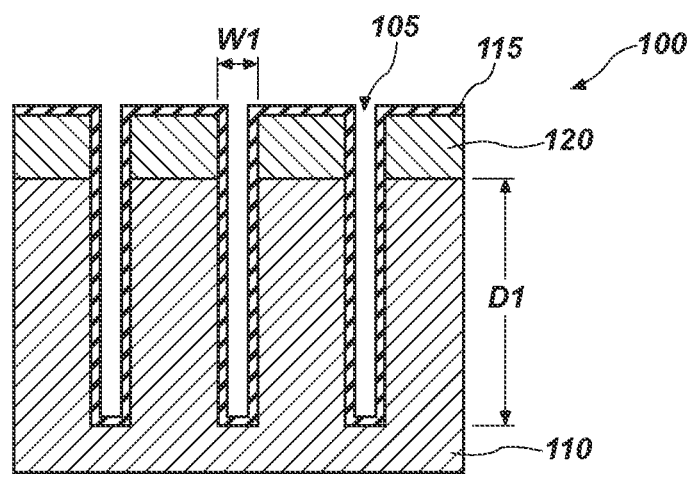
FIGS. 2-5B are schematic, cross-sectional views showing the fabrication process of a semiconductor structure in accordance with some embodiments of the disclosure.

The HAR openings are formed in one or more dielectric materials, such as in a single dielectric material or in a stack of dielectric materials, on a substrate. As shown in FIG. 2, a semiconductor structure 100 including HAR openings 105 is formed in a dielectric material 110 on a substrate (not shown). The HAR openings 105 may have a depth, d1, of from about 0.5 μm to about 10 μm and a critical dimension (CD), such as a width, w1, of from about 10 nm to about 150 nm. The HAR openings 105 may have a substantially circular cross-section, or may have some other shape. A protective material 115 is formed over sidewalls of the dielectric material 110 and over sidewalls and a top surface of a patterned hardmask 120. For simplicity, FIG. 2 illustrates three HAR opening 105 in the dielectric material 110, which is illustrated as a single material. However, multiple HAR openings 105 may be formed in the dielectric material 110, which may include a single material or a stack of dielectric materials 110. The dielectric materials in the stack may differ from one another in composition and may include alternating dielectric materials that differ in composition.

The dielectric material 110 may be a silicon oxide, a silicon nitride, a silicon carbide, an oxynitride, an oxycarbide, a carbonitride, polysilicon, or combinations thereof. The dielectric material 110 may be undoped or doped, such as with a dopant including, but not limited to, boron, phosphorus, or arsenic. The dielectric material 110 may include the stack of alternating dielectric materials, such as alternating silicon oxide and silicon nitride materials or alternating silicon oxide and polysilicon materials. In some embodiments, the dielectric material 110 includes a stack of alternating silicon oxide and silicon nitride materials. In other embodiments, the dielectric material 110 includes a stack of alternating silicon oxide and polysilicon materials. The stack may include at least about 50 tiers of alternating dielectric materials, such as at least about 80 tiers of alternating dielectric materials, at least about 90 tiers of alternating dielectric materials, or at least about 100 tiers of alternating dielectric materials.

The protective material 115 is conformally formed over at least a portion of the sidewalls of the dielectric material 110. The protective material 115 may be formed over the sidewalls at a sufficient thickness to protect the underlying dielectric material 110 from subsequent etch acts, such as lateral etching of the dielectric material 110. By way of example only, the thickness of the protective material 115 may range from about 1 nm to about 10 nm, such as less than about 5 nm, less than about 2 nm, or less than about 1.5 nm. The sidewalls of the dielectric material 110 may be substantially vertical to the desired depth d1 of the HAR opening 105. The sidewalls may be characterized as substantially vertical in that a critical dimension (CD) of a middle region of the HAR opening 105 is about the same as the CD at the top region or the bottom region. Therefore, the width of the HAR openings 105 is substantially uniform along its entire depth d1. While the protective material 115 may be formed on substantially all of the sidewalls of the dielectric material 110, the protective material may also be selectively formed on regions of the sidewalls where bowing is expected to occur, such as on the middle regions. In other words, the protective material 115 may be formed on the sidewalls where lateral etching is expected to occur.

The protective material 115 may be formed by thermal chemical vapor deposition (CVD), plasma-enhanced CVD, initiated CVD, photo-initiated CVD, atomic layer deposition (ALD), molecular layer deposition (MLD), or combinations thereof. In some embodiments, the protective material is formed by ALD. As discussed in more detail below, the protective material 115 is formed from one or more protective material precursors that react with (e.g., adsorb to) the sidewalls of the dielectric material 110.

Figure 3:
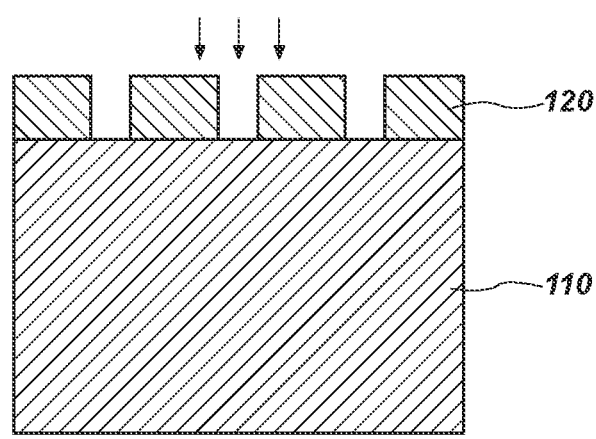

To form the HAR openings 105, a hardmask material is formed over the dielectric material 110. The hardmask material may be a spin-on hardmask material, an organo siloxane material, a carbon-based material, such as amorphous carbon, a carbon-silicon material, a nitride material, such as silicon nitride or titanium nitride, a metal material, or a metal oxide material. As shown in FIG. 3, the hardmask material is patterned by conventional techniques to form a patterned hardmask 120 having openings that correspond to the location of the HAR openings 105 to be formed in the dielectric material 110. The patterned hardmask 120 is used as a mask to form the HAR openings 105. During the formation of the HAR openings 105, a minimal portion of the hardmask material may be removed. Therefore, the hardmask material is formed at a thickness sufficient to withstand the process conditions used to form the HAR openings 105. By way of example only, the thickness at which the hardmask material is formed may range from about 500 nm to about 1500 nm.

The HAR openings 105 are formed in the dielectric material 110 by an etch process, such as by anisotropic etch process. By way of example only, the etch process may be a plasma-based etch process (e.g., a reactive ion etch process). The etch composition used to form the HAR openings 105 and the protective material 115 includes at least one etch gas, at least one additive gas, and at least one protective material precursor. Components of the etch composition are gaseous under the process conditions, such as the process temperature and pressure. The etch gas may be selected depending on the dielectric material(s) in which the HAR openings 105 are to be formed. By way of example only, the etch gas may be a fluorocarbon-based ($C_xF_z$ or $C_xH_yF_z$) etch gas or other halogen-based etch gas, where x and z are whole numbers and y is an integer. The etch gas may include, but is not limited to, $CF_4$, $NF_3$, $CHF_3$, $CH_3F$, $CH_2F_2$, $CH_3F$, $C_4F_6$, $C_5F_8$, $CF_3I$, $CF_3Br$, $BF_3$, $SF_6$, $Cl_2$, $HBr$, $HBr_4$, $BrF_3$, $BrF_5$, $BrF_7$, $BrF$, $KrBr_6$, or combinations thereof. The etch gas of the etch composition may remove at least a portion of the dielectric material in the vertical direction without substantially removing the dielectric material in the lateral direction. In some embodiments, the etch gas includes $NF_3$ and $CF_3I$. The additive gas may include, but is not limited to, $H_2$, $O_2$, CO, $CO_2$, COS, $CH_4$, $C_xH_y$, $H_2S$, $NH_3$, He, Ne, Ar, Kr, Xe, or combinations thereof. In some embodiments, the additive gas is $H_2$. As discussed in more detail below, the protective material precursor may be selected depending on the protective material 115 to be formed. By including the additive gas and the protective material precursor in the etch composition, the protective material 115 may be formed in-situ to the final depth d1 of the HAR openings 105 and at a sufficient thickness to protect the sidewalls of the dielectric material 110.

Figure 4A:
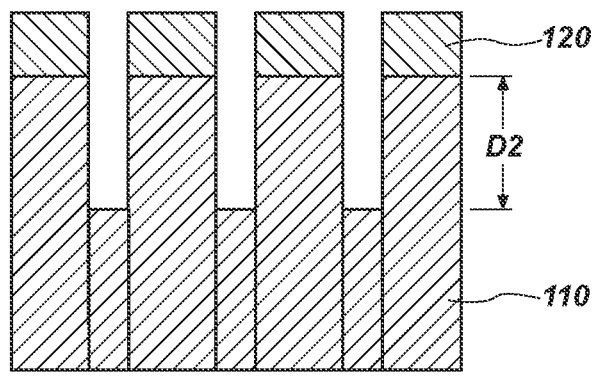

The dielectric material 110 is exposed to the etch composition (indicated by arrows in FIG. 3) through the patterned hardmask 120 and at a temperature of less than about 0° C., such as between about −100° C. and less than about 0° C. The referenced temperature is that of the electrostatic chuck upon which the substrate including the dielectric material and protective material is positioned. The dielectric material 110 may be exposed to the etch gas and protective material precursor of the etch composition at the same time, or may be separately exposed to the etch gas and the protective material precursor, with the additive gas introduced with either or both of the etch gas and protective material precursor. Using the anisotropic etch process, the dielectric material 110 is removed in the downward (e.g., vertical) direction. The dielectric material 110 is removed (e.g., etched) at a temperature of less than about −10° C., less than about −20° C., less than about −30° C., less than about −40° C., less than about −50° C., less than about −60° C., less than about −70° C., less than about −80° C., less than about −90° C., or greater than or equal to about −100° C. By way of example only, the temperature at which the dielectric material 110 is etched may be between about −100° C. and about −40° C. The dielectric material 110 may be exposed to the etch composition for an amount of time sufficient to form an initial depth d2 of the HAR openings 105 (as shown in FIG. 4A) or to form the HAR openings 105 to their final depth d1 (as shown in FIG. 2).

Figure 4B:
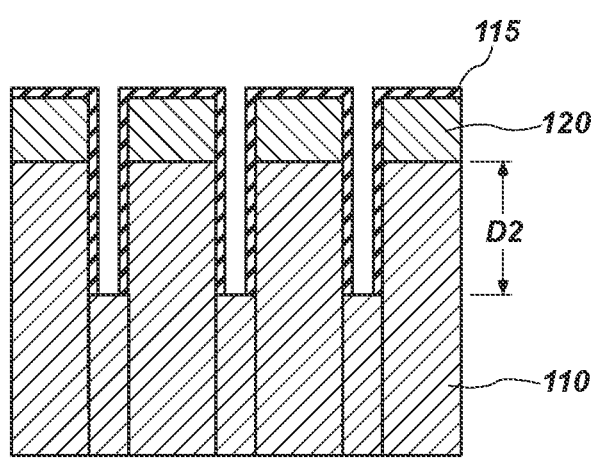
Figure 5A:
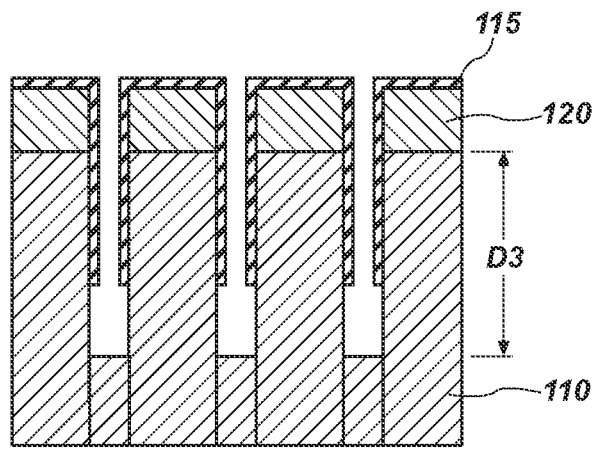
Figure 5B:
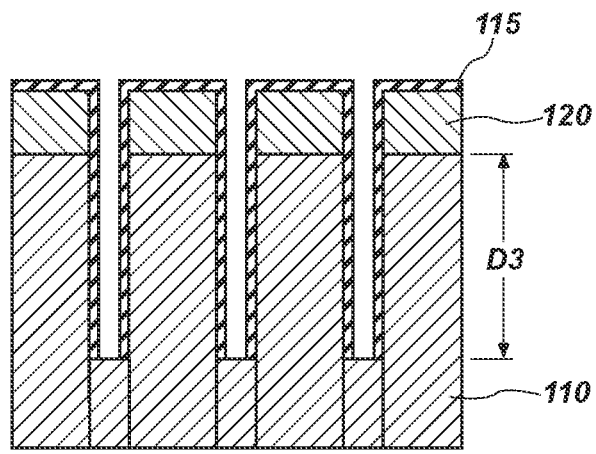

The protective material precursor of the etch composition reacts with reactive species in the etch composition, the dielectric material, and/or with an additional protective material precursor to conformally form the protective material 115 on the sidewalls of the dielectric material 110 and on the top surface of the patterned hardmask 120, as shown in FIGS. 4B and 5B. The protective material precursor absorbs to the sidewalls of the dielectric material 110 to form the protective material 115, which reduces or eliminates bowing of the sidewalls of the dielectric material 110. The extent of bowing is quantified by a comparison of the CD of the dielectric material at a bow region of an opening compared to the CD of the dielectric material at a lower region or an upper region of the opening. The protective material 115 also reduces or eliminates removal of the hardmask material from the patterned hardmask 120 during subsequent etch acts, reducing erosion of the patterned hardmask. In addition to being reactive at a temperature between about −100° C. and less than about 0° C., the protective material precursor is selected to produce the protective material 115 having a desired surface energy and volatility under the process conditions (e.g., etch composition, time, temperature, pressure) at which the protective material 115 is formed, ensuring that the protective material 115 may be easily removed during subsequent process acts.

The protective material 115 may be formed to the initial depth d2 or to the final depth d1 depending on the extent of dielectric material 110 exposed after forming the HAR openings 105. Since the protective material precursor is a gaseous species and is volatile, the protective material precursor easily diffuses into the initial depth d2 or the final depth d1 of the HAR openings 105, enabling the protective material 115 to be formed on the exposed surfaces of the sidewalls of the dielectric material 110. Depending on the technique used to form the protective material 115, a second or subsequent protective material precursor may be introduced into the HAR openings 105 to react with a first protective material precursor absorbed on the sidewalls of the dielectric material 110. By way of example only, if the protective material 115 is formed by ALD, two or more protective material precursors may be introduced into the HAR openings 105 and absorbed to the sidewalls of the dielectric material 110 to form the protective material 115.

The HAR openings 105 and protective material 115 may be formed by a single etch process that forms the HAR openings 105 to their final depth d1 and forms the protective material 115 on the exposed sidewalls of the dielectric material 110 as shown in FIG. 2. The HAR openings 105 and the protective material 115 may be formed substantially simultaneously by exposing the dielectric material 110 to the etch composition containing the etch gas, the additive gas, and the protective material precursor. Alternatively, the HAR openings 105 and protective material 115 may be formed sequentially, with the HAR openings 105 formed to the depth d1 and the protective material 115 subsequently formed on the exposed sidewalls of the dielectric material 110. The HAR openings 105 and the protective material 115 may be formed by exposing the dielectric material 110 to the etch composition containing the etch gas and the additive gas, followed by a purge, and then exposing the dielectric material 110 to the etch composition containing the additive gas and the protective material precursor. The HAR openings 105 and protective material 115 may also be formed in a cyclic fashion, with the initial depth d2 of the HAR openings 105 formed as shown in FIG. 4A, followed by forming the protective material 115 on the exposed sidewalls of the dielectric material 110 to the depth d2 as shown in FIG. 4B. One or more cycles of the etch and formation acts may be conducted to extend the initial depth d2 of the HAR openings 105 to their final depth d1 and form the protective material 115 on exposed sidewalls of the dielectric material 110. A purge may be conducted between the etch and formation acts. As shown in FIG. 5A, the depth d2 of the HAR openings 105 may be increased, such as to depth d3, and the protective material 115 formed on exposed sidewalls of the dielectric material 110 to the depth d3, as shown in FIG. 5B. With each etch and formation act (e.g., cycle), the depth of the HAR openings 105 and a thickness of the protective material 115 are increased. The etch and formation acts may be conducted a sufficient number of times until the HAR openings 105 are at their final, desired depth d1 and a desired total thickness of the protective material 115 is achieved. Each cycle of the etch and formation acts may form the protective material 115 at a thickness of from about 0.1 nm to about 5 nm. The etch and formation acts may also be controlled by adjusting the concentration of the etch gas, additive gas, and protective material precursor and the exposure time to which the dielectric material 110 is exposed.

The protective material precursor may be sufficiently reactive to react with the desired species in the etch composition and/or the dielectric material at a temperature of less than about 0° C., such as between about −100° C. and less than about 0° C., and without using a plasma. The reaction of the protective material precursor may be thermally driven and may not require a plasma to provide the reactivity. Therefore, the protective material 115 may be thermally deposited on the semiconductor structure 100. For instance, the protective material precursor may be reactive at a temperature of between about −100° C. and less than about 0° C., such as at a temperature of less than about −10° C., than about −20° C., less than about −30° C., less than about −40° C., less than about −50° C., less than about −60° C., less than about −70° C., less than about −80° C., less than about −90° C., or greater than about −100° C. The referenced temperature is that of an electrostatic chuck upon which the substrate including the dielectric material and protective material is positioned. In some embodiments, the protective material 115 is formed at about −50° C. In other embodiments, the protective material 115 is formed at about −60° C. The pressure at which the protective material precursor is reacted may also be controlled to form the protective material 115.

Depending on whether an insulative organic material, conductive organic material, boron-containing material, sulfur-containing material, or metal is formed as the protective material 115, the protective material 115 may be formed in the presence of the plasma or in the absence of the plasma. By way of example only, if the protective material 115 is an organic material, the protective material 115 may be formed in the absence of the plasma, such as by turning off the plasma following the formation of the HAR openings 105. In other words, the protective material 115 is formed without a plasma following the formation of the HAR openings 105 using the plasma. The protective material 115 may be formed from a protective material precursor or combinations thereof with one or more of the protective material precursors mentioned below. If, however, the protective material 115 is an inorganic material (a boron-containing material, a sulfur-containing material, or a metal), the plasma may remain present during the formation of the protective material 115.

The insulative organic material may include, but are not limited to, poly(p-xylylene), poly(monochloro-p-xylylene), poly(dimethylsiloxane), poly(oxymethylene), a polyester, a polyamide, a polyacrylate, or a polymethacrylate. The insulative organic material may also include methyl, ethyl, or ether substituents on the above materials. The protective material precursor may be a compound that reacts at a temperature of less than about 0° C. to form one of the listed insulative organic materials. By way of example only, the protective material precursor may be an organic solvent or organosilane that exhibits a melting point below 0° C., such as acetone, acetonitrile, 1-butanol, diethylether, ethylacetate, or tetrahydrofuran, or an organosilane having the listed functional group as a ligand to the silicon atom. To form the insulative organic material as the protective material 115, no plasma may be used during the protective material 115 deposition.

The conductive organic material may include a poly(thiophene), such as poly(3,4-ethylenedioxythiophene), poly(pyrrole), or poly(3-thiopheneacetic acid). The protective material precursor may be a compound that reacts at a temperature of less than about 0° C. to form one of the listed insulative organic materials. To form the conductive organic material as the protective material 115, no plasma may be used during the protective material 115 deposition.

The protective material 115 may also include compounds of sulfur or selenium instead of carbon.

The boron-containing material may include a boron nitride-based material or a boron oxide-based material. The protective material precursor may be a compound that reacts at a temperature of less than about 0° C., such as $BH_3$, $B_2H_6$, $B_xH_y$, $C_2B_{10}H_{12}$, $C_xB_yH_z$, $BF_3$, $BCl_3$, $BBr_3$, or combinations thereof. In some embodiments, the protective material precursor includes $BH_3$. To form the boron-containing material as the protective material 115, the plasma may be used during the protective material 115 deposition.

The sulfur-containing material may include a sulfur-based material. The protective material precursor may be a compound that reacts at a temperature of less than about 0° C., such as CS, $CS_2$, COS, $C_4H_3S$, $H_2S$, $S_2$, $SO_2$, $S_2Cl_2$, $SF_2$, $SF_6$, $SBr_2$, $SBr_4$, $S_2Br_2$, $Br_2S_6$, $WS_2$, $WS_3$, or combinations thereof. In some embodiments, the protective material precursor includes $SF_6$. To form the sulfur-containing material as the protective material 115, the plasma may be used during the protective material 115 deposition.

The metal may be aluminum (Al), iridium (Ir), titanium (Ti), tungsten (W), germanium (Ge), platinum, palladium, or ruthenium (Ru). The protective material precursor may be a compound that reacts at a temperature of less than about 0° C., such as $AlCl_3$, $IrF_6$, $TiCl_4$, $WF_4$, $WF_6$, $WBr_2$, $WBr_4$, $WS_2$, $WS_3$, $GeCl_4$, $GeF_4$, or $RuO_4$, or a transition metal parylene-based polymer, such as a Ru parylene-based polymer, a Pt parylene-based polymer, or a Pd parylene-based polymer. In some embodiments, the protective material precursor includes $WF_6$. To form the metal as the protective material 115, the plasma may be used during the protective material 115 deposition. In some embodiments, the etch composition includes $SF_6$, $NF_3$, $CF_3I$, and $H_2$.

The etch gas, the additive gas, and the protective material precursor are present in the etch composition at a concentration sufficient to remove (e.g., etch) the dielectric material 110 and to form the protective material 115. The relative amounts of the etch gas, the additive gas, and the protective material precursor may be selected to balance etching the dielectric material 110 at a desired rate and forming the protective material 115 on the sidewalls of the dielectric material 110. By way of example only, the etch gas and the protective material precursor may be present at approximately equivalent amounts and the additive gas may be present at an additive amount. The etch gas and the additive gas may be present at from about 200 standard cubic centimeters per minute (sccm) to about 250 sccm. The protective material precursor may be present at from about 0.1 sccm to about 100 sccm or greater. Alternatively, the etch gas may be present in excess and the protective material precursor and additive gas may be present at an additive amount. The exposure time to which the dielectric material 110 is exposed to the etch composition may also be adjusted to balance etching the dielectric material 110 and forming the protective material 115.

Accordingly, a method of forming high aspect ratio openings is disclosed. The method comprises removing a portion of a dielectric material at a temperature less than about 0° C. to form at least one opening in the dielectric material. The at least one opening comprises an aspect ratio of greater than about 30:1. A protective material is formed in the at least one opening and on sidewalls of the dielectric material at a temperature less than about 0° C.

The protective material 115 may be sacrificial in that subsequent processing substantially removes the protective material 115 from the HAR openings 105. The protective material 115 may be removed before subsequent process acts are conducted to form a complete semiconductor device (see FIG. 6) that includes the semiconductor structure 100. By way of example only, the protective material 115 may be removed as a result of exposure to increased temperature during subsequent processing, such as exposure to a temperature above about 5° C. For instance, the protective material 115 may volatilize (e.g., sublimate) when exposed to a temperature above about 5° C. Alternatively, the protective material 115 may be removed by exposure to a $H_2$ reductive environment or a low level of oxygen during the subsequent processing acts.

The HAR openings 105 and the protective material 115 may be formed in an apparatus including at least one reaction chamber. The apparatus may include the reaction chamber, a shower head, at least one inlet, at least one outlet, a chiller, an electrostatic chuck, and a system controller. The apparatus may be a conventional etch tool. The system controller may adjust the process conditions within the apparatus, such as the etch composition and flow rate, temperature, pressure, and plasma conditions (such as RF bias power levels and exposure times). The apparatus may be configured to conduct the plasma-based etch process and to form the protective material 115 with or without the plasma. The process conditions may be adjusted utilizing a user interface as known in the art. The semiconductor structure 100 including the patterned hardmask 120 and the dielectric material 110 is positioned on the electrostatic chuck and the etch composition introduced into the reaction chamber through the inlet. The etch composition may remain in the reaction chamber for an amount of time sufficient to form the HAR openings 105 to their initial depth d2 or final depth d1. The etch gas and protective material precursor of the etch composition may be introduced to the reaction chamber at the same time through the inlets, or may be separately introduced to the reaction chamber through the inlets, with the additive gas introduced with either or both of the etch gas and protective material precursor. Purge acts may be conducted between the introduction of the etch gas and the introduction of the protective material precursor through the outlets. After the protective material 115 is formed, excess etch composition that has not absorbed to the sidewalls of the dielectric material 110 or volatile byproducts may also be removed (e.g., purged) from the reaction chamber through the outlets.

The temperature and pressure conditions within the apparatus may be adjusted to conduct the one or more dielectric material 110 removal acts and the protective material 115 formation acts. By adjusting the temperature and pressure conditions, the etch composition may be transported into the HAR openings 105 at a sufficient concentration to etch the dielectric material 110 and form the protective material 115. The dielectric material 110 removal acts and the protective material 115 formation acts may be conducted in the same reaction chamber or in different reaction chambers. If the dielectric material 110 removal acts and the protective material 115 formation acts are conducted in one reaction chamber, the etch gas, additive gas, and protective material precursor may be separately or simultaneously introduced into the reaction chamber containing the semiconductor structure 100, with purge acts conducted as needed. Alternatively, the removal acts of the dielectric material 110 may occur in a first reaction chamber of the apparatus and the protective material formation acts may occur in a second reaction chamber of the apparatus. If the apparatus includes multiple reaction chambers, the etch gas of the etch composition may be introduced into the first reaction chamber containing the semiconductor structure 100 and the protective material precursor of the etch composition may be introduced into the second reaction chamber containing the semiconductor structure 100, with the additive gas introduced with either or both of the etch gas and protective material precursor. The semiconductor structure 100 may be transferred between the first and second reaction chambers of the apparatus by conventional structures, which are not described in detail herein. If multiple reaction chambers are used, the semiconductor structure 100 may be transferred between the reaction chambers without breaking vacuum.

The chiller may be configured to maintain the electrostatic chuck at the desired temperature (less than about 0° C.), such as between about −100° C. and about −40° C. By way of example only, the chiller may utilize liquid nitrogen to maintain the desired temperature of the electrostatic chuck. The chiller may be operatively coupled to a bottom electrode of the electrostatic chuck to cool the electrostatic chuck to the desired temperature. If the apparatus includes multiple reaction chambers, each of the reaction chambers may be maintained at less than about 0° C.

The pressure at which the dielectric material 110 removal acts and the protective material 115 formation acts are conducted may also be controlled, such as between about 1 mTorr and about 10 Torr, between about 10 mTorr and about 10 Torr, between about 10 mTorr and about 1 Torr, between about 20 mTorr and about 1 Torr, between about 1 mTorr and about 100 mTorr, or between about 20 mTorr and about 50 mTorr. The pressure within the reaction chamber may be maintained at a single value within the above ranges or may be adjusted to different values within the above ranges during the formation of the HAR openings 105 and the protective material 115. By way of example only, the pressure may be increased or decreased between the dielectric material 110 removal acts and the protective material 115 formation acts. The dielectric material 110 removal acts may be conducted at a pressure between about 1 mTorr and about 10 Torr and the protective material 115 formation acts may be conducted at a pressure between about 20 mTorr and about 1 Torr.

The plasma conditions (e.g., RF bias power levels and exposure times) may be selected and generated in the apparatus by conventional techniques. The plasma may be present during both the dielectric material 110 removal acts and the protective material 115 formation acts. The semiconductor structure 100 may be exposed to the plasma of the etch composition to etch the dielectric material 110 to the final depth d1 or the initial depth d2 and to form the protective material 115 on the sidewalls of the dielectric material 110. Alternatively, the plasma may be present only during the dielectric material 110 removal acts. The semiconductor structure 100 may be exposed to the plasma of the etch composition to etch the dielectric material 110 to the final depth d1 or the initial depth d2, and then the plasma may be turned off. The protective material 115 may then be formed on the sidewalls of the dielectric material in the absence of the plasma.

Figure 6:
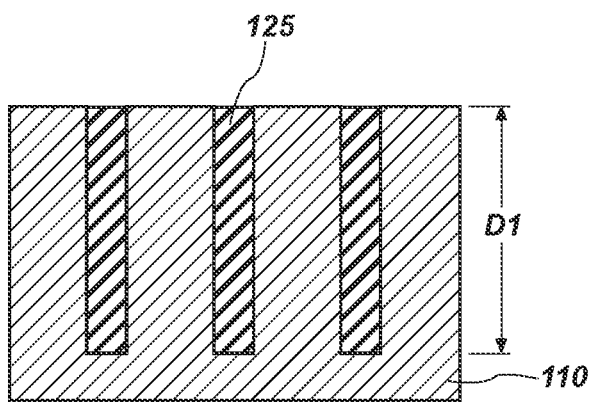
FIG. 6 is a schematic, cross-sectional view of a semiconductor device in accordance with some embodiments of the disclosure.

The patterned hardmask 120 may be removed, as shown in FIG. 6, and features 125 formed in the HAR openings 105 of the semiconductor structure 100. The features 125 may include, but are not limited to, capacitors, pillars, channel regions, etc. The features 125 have an aspect ratio of greater than about 50:1, such as greater than about 80:1, greater than about 90:1, or greater than about 100:1. The features 125 are formed in the HAR openings 105 by conventional techniques, which are not described in detail herein. Since the HAR openings 105 have substantially vertical sidewalls (e.g., low bowing) and uniform widths, the features 125 also have substantially vertical sidewalls and uniform widths. Thus, the features 125 formed according to embodiments of the disclosure are more uniform than those formed by conventional processes. Subsequent process acts may be conducted to form a semiconductor device (see FIG. 6) from the semiconductor structure 100 that contains the features 125. The semiconductor device may include, but is not limited to, a 3D NAND Flash memory device, a 3D DRAM device, or a 3D crosspoint memory device. In some embodiments, the semiconductor device includes the stack having at least about 50 tiers of alternating dielectric materials, such as at least about 80 tiers of alternating dielectric materials, at least about 90 tiers of alternating dielectric materials, or at least about 100 tiers of alternating dielectric materials, in which the HAR openings 105 are formed. The substantially vertical sidewalls formed by embodiments of the disclosure are substantially continuous along a length thereof, as shown in FIGS. 2 and 6, in that no pinching in of the dielectric material 110 occurs. In addition, there are no interfaces between material(s) of the features 125 in the HAR openings 105. In comparison, sidewalls of dielectric material stacks formed by conventional techniques include portions thereof that are pinched in and/or one or more interfaces between material(s) of the features, as shown in FIG. 1.

Accordingly, a method of forming HAR features is disclosed. The method comprises forming openings to a first depth in a stack of dielectric materials at a temperature of less than about 0° C. A protective material is formed on sidewalls of the stack exposed to the first depth at a temperature of less than about 0° C. The openings are extended to a second depth and another protective material is formed on sidewalls of the stack exposed to the second depth at a temperature of less than about 0° C. The openings are extended to a final depth comprising an aspect ratio of at least about 30:1 and an additional protective material is formed on sidewalls of the stack exposed to the final depth at a temperature of less than about 0° C. Features are formed in the openings.

Accordingly, a semiconductor device is disclosed and comprises a dielectric material stack comprising at least about eighty tiers of alternating dielectric materials. The dielectric material stack has substantially vertical sidewalls and at least one feature within the dielectric material stack, the at least one feature comprising an aspect ratio of at least about 30:1.

It was surprising that that the protective material precursor formed the protective material 115 at low temperatures, such as between about −100° C. and less than about 0° C. While passivation materials have conventionally been formed on sidewalls of dielectric materials, the conventional passivation materials are formed at significantly higher temperatures, such as above about 20° C. Precursors of such passivation materials are not sufficiently reactive at the temperature (less than about 0° C., such as between about −100° C. and less than about 0° C.) used in embodiments of the disclosure to form the protective material on the sidewalls of dielectric materials. It was also surprising that the protective material precursor used in embodiments of the disclosure did not etch the dielectric material at the process temperature. Some of the protective material precursors, such as $SF_6$, are known to etch silicon oxide, silicon nitride, and polysilicon at a high rate. Therefore, it was surprising and unexpected that the protective material precursor formed the protective material 115 at between about −100° C. and less than about 0° C., rather than etching the dielectric material.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming high aspect ratio openings, comprising:
removing a portion of a dielectric material at a temperature less than about 0° C. to form at least one opening in the dielectric material, the at least one opening comprising an aspect ratio of greater than about 30:1; and
forming a protective material in the at least one opening and on sidewalls of the dielectric material using atomic layer deposition (ALD), molecular layer deposition (MUD), or plasma chemical vapor deposition (CVD) at a temperature between about −1.00° C. and about −20° C., the protective material comprising a boron-containing material, a sulfur-containing material, or a metal material.

2. The method of claim 1, wherein forming a protective material in the at least one opening and on sidewalls of the dielectric material comprises forming the protective material comprising a sulfur-containing material.

3. The method of claim 1, wherein forming a protective material in the at least one opening and on sidewalls of the dielectric material comprises forming the protective material at a temperature of from about −50° C. to about −60° C.

4. The method of claim 1, wherein removing a portion of a dielectric material at a temperature less than about 0° C. to form at least one opening in the dielectric material comprises forming the at least one opening exhibiting an aspect ratio of greater than about 50:1.

5. The method of claim 4, wherein removing a portion of a dielectric material comprises removing the portion of the dielectric material at a first pressure between about 1 mTorr and about 10 Torr and forming a protective material comprises forming the protective material at a second pressure between about 20 mTorr and about 1 Torr.

6. The method of claim 4, wherein forming a protective material in the at least one opening and on sidewalls of the dielectric material comprises forming the protective material with a thickness of between about 1 nm and about 10 nm.

7. The method of claim 4, wherein removing a portion of a dielectric material comprises removing the portion of the dielectric material with a plasma and forming a protective material comprises forming the protective material in the absence of a plasma.

8. A method of forming high aspect ratio features, comprising:
forming openings in a stack of dielectric materials at a temperature of less than about 0° C., the openings comprising a first depth;
forming a protective material at a temperature between about −100° C. and about −40° C. on sidewalk of the stack exposed to the first depth;
extending the openings to a second depth;
forming another protective material at a temperature between about −100° C. and about −40° C. on sidewalls of the stack exposed to the second depth;
extending the openings to a final depth comprising an aspect ratio of at least about 30:1;
forming an additional protective material at a temperature between about −100° C. and about −40° C. on sidewalls of the stack exposed to the final depth; and
forming features in the openings.

9. The method of claim 8, wherein forming features in the openings comprises forming the feature in the openings are selected from a group consisting of capacitors, pillars and channel regions.

10. The method of claim 8, wherein forming features in the openings comprises forming the features comprising capacitors.

11. The method of claim 8, wherein forming openings in a stack of dielectric materials comprises forming the openings in the stack comprising 50 tiers of alternating dielectric materials.

12. The method of claim 8, wherein forming openings in a stack of dielectric materials comprises forming the openings in the stack comprising 80 tiers of alternating dielectric materials.

13. The method of claim 8, further comprising removing the protective material from the openings.

14. The method of claim 13, wherein removing the protective material from the openings comprises removing the protective material by sublimation.

15. The method of claim 13, wherein removing the protective material from the openings comprises removing the protective material from the openings by exposing the protective material to a temperature of at least 5° C.

16. The method of claim 7, wherein extending the openings to a second depth and forming another protective material at a temperature between about −100° C. and about −40° C. on sidewall s of the stack comprises conducting the extending and the forming in a same reaction chamber.

17. A method of forming high aspect ratio openings, comprising:
substantially simultaneously introducing an etch gas, an additive gas, and a protective material precursor into a chamber comprising a semiconductor structure, the etch gas comprising:
at least one material selected from the group consisting of carbon tetrafluoride ($CF_4$), nitrogen trifluoride ($NF_3$), trifluoromethane ($CHF_3$), methyl fluoride ($CH_3F$), difluoromethane ($CH_2F_2$), octofluorocyclobutane ($C_4F_8$), hexafluoro-1,3, butadiene ($C_4F_6$), cesium octofluoride ($CsF_8$), trifluoroiodomethane ($CF_3I$), trifluorobromomethane ($CF_3Br$), borontrifluoride ($BF_3$), sulfur hexafluoride (SF$_6$), chlorine (Cl$_2$), hydrogen bromide (HBr, hydrogen tetrabromide, bromine trifluoride (BrF$_3$), bromine octofluoride (BrF$_8$), bromine heptafluoride (BrF$_7$), and krypton hexabromine (KrBr$_6$), wherein substantially simultaneously introducing the etch gas, the additive gas, and the protective material precursor into the chamber comprises:

removing a portion of a dielectric material of the semiconductor structure at a temperature less than about −20° C. to form at least one opening in the dielectric material in a single act, the at least one opening comprising an aspect ratio of greater than about 30:1; and substantially simultaneously forming a protective material in the at least one opening and on sidewalls of the dielectric material at a temperature less than about −20° C.

18. The method of claim 17, further comprising removing the protective material from the at least one opening by heating the dielectric material to above 5° C.

19. The method of claim 17, wherein substantially simultaneously introducing an etch gas, an additive gas, and a protective material precursor into a chamber comprising a semiconductor structure comprises introducing gases to generate a pressure in the chamber between about 20 mTorr and about 1 Torr.

20. The method of claim 17, wherein substantially simultaneously introducing an etch gas, an additive gas, and a protective material into a chamber comprises introducing the additive gas selected from the group consisting of H$_2$, O$_2$, CO, CO$_2$, COS, CH$_4$, C$_x$H$_y$, H$_2$S, NH$_3$, Ne, Ar, Kr, and Xe and the protective material precursor selected from the group consisting of an insulative organic polymer, a conductive organic polymer, a boron-containing material, a sulfur-containing material, and a metal.

* * * * *

UNITED STATES PATENT AND TRADEMARK OFFICE
CERTIFICATE OF CORRECTION

PATENT NO. : 11,417,565 B2
APPLICATION NO. : 17/155770
DATED : August 16, 2022
INVENTOR(S) : Ken Tokashiki, John A. Smythe and Gurtej S. Sandhu It is certified that error appears in the above-identified patent and that said Letters Patent is hereby corrected as shown below:

In the Specification
| | | |
|---|---|---|
| Column 4, | Line 33, | change "("SOT")" to --("SOI")-- |
| Column 6, | Line 20, | after "CH$_3$F," insert --C$_4$F$_8$,-- |

In the Claims
| | | | |
|---|---|---|---|
| Claim 1, | Column 13, | Line 42, | change "(MUD)," to --(MLD),-- |
| Claim 1, | Column 13, | Line 44, | change "–1.00° C." to -- –100° C.-- |
| Claim 5, | Column 13, | Line 60, | change "claim 4," to --claim 1,-- |
| Claim 6, | Column 13, | Line 66, | change "claim 4," to --claim 1,-- |
| Claim 7, | Column 14, | Line 3, | change "claim 4," to --claim 1,-- |
| Claim 8, | Column 14, | Line 14, | change "sidewalk" to --sidewalls-- |
| Claim 16, | Column 14, | Line 50, | change "claim 7," to --claim 8,-- |
| Claim 16, | Column 14, | Line 53, | change "sidewall s" to --sidewalls-- |
| Claim 17, | Column 15, | Line 2, | change "(HBr," to --(HBr),-- |
| Claim 20, | Column 16, | Line 14, | change "C$_x$ H$_y$," to --C$_x$H$_y$,-- and after "NH$_3$," insert --He,-- before "Ne," |

Signed and Sealed this
Twenty-first Day of February, 2023

Katherine Kelly Vidal
*Director of the United States Patent and Trademark Office*